United States Patent
Tanimoto

(10) Patent No.: US 9,214,523 B2
(45) Date of Patent: Dec. 15, 2015

(54) FIELD-EFFECT TRANSISTOR

(71) Applicant: NICHIA CORPORATION, Anan-shi (JP)

(72) Inventor: Masashi Tanimoto, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 23 days.

(21) Appl. No.: 14/290,903

(22) Filed: May 29, 2014

(65) Prior Publication Data
US 2014/0353736 A1 Dec. 4, 2014

(30) Foreign Application Priority Data

May 30, 2013 (JP) .................................. 2013-113586
May 22, 2014 (JP) .................................. 2014-106316

(51) Int. Cl.
| H01L 29/76 | (2006.01) |
| H01L 29/417 | (2006.01) |
| H01L 29/423 | (2006.01) |
| H01L 29/778 | (2006.01) |
| H01L 29/20 | (2006.01) |

(52) U.S. Cl.
CPC .... *H01L 29/41758* (2013.01); *H01L 29/41775* (2013.01); *H01L 29/42312* (2013.01); *H01L 29/42316* (2013.01); *H01L 29/7786* (2013.01); *H01L 29/2003* (2013.01)

(58) Field of Classification Search
None
See application file for complete search history.

(56) References Cited

U.S. PATENT DOCUMENTS 7,294,892 B2 * 11/2007 Chen .............................. 257/401
2004/0206983 A1 10/2004 Yi et al.

FOREIGN PATENT DOCUMENTS

| JP | 02-130934 | 5/1990 |
| JP | 05-013759 | 1/1993 |
| JP | 2004-320040 | 11/2004 |
| JP | 2005-303137 | 10/2005 |
| JP | 2007-048842 | 2/2007 |

* cited by examiner

*Primary Examiner* — Fei Fei Yeung Lopez
(74) *Attorney, Agent, or Firm* — Mori & Ward, LLP

(57) ABSTRACT

A field-effect transistor includes a plurality of unit elements, an insulating film, and a wiring. The plurality of unit elements include a semiconductor layer having a first surface, a plurality of drain electrodes, gate electrodes, and a source electrode. The source electrode is electrically continuously provided across the plurality of unit elements outside the gate electrodes on the first surface and has narrow parts between the gate electrodes which are spaced apart from each other and which belong to adjacent unit elements among the plurality of unit elements. The narrow parts have a width narrower than a width of other parts of the source electrode. The insulating film has openings provided on the source electrode. The insulating film covers the source electrode across the plurality of unit elements. The openings are arranged at the other parts of the source electrode on both sides of each of the narrow parts.

15 Claims, 9 Drawing Sheets

FIELD-EFFECT TRANSISTOR

CROSS-REFERENCE TO RELATED APPLICATIONS

The present application claims priority under 35 U.S.C. §119 to Japanese Patent Application No. 2013-113586, filed on May 30, 2013, and Japanese Patent Application No. 2014-106316, filed on May 22, 2014. The contents of these applications are incorporated herein by reference in their entirety.

BACKGROUND OF THE INVENTION

1. Field of the Invention

The present invention relates to a field-effect transistor.

2. Description of the Related Art

A field-effect transistor includes a source electrode, a drain electrode, and a gate electrode. The electrode structure with the source electrode, drain electrode, and gate electrode is a very important factor for obtaining the high maximum current and the low on-resistance. As such an electrode structure, JP 2004-320040A discloses a finger-like electrode structure (see FIG. 1 of JP 2004-320040 A), and an electrode structure with mesh-like gate electrodes (see FIG. 2B or the like of JP 2004-320040 A). JP 2007-048842 A discloses an electrode structure with drain electrodes arranged in an island-like manner.

SUMMARY OF THE INVENTION

According to one aspect of the present invention, a field-effect transistor includes a plurality of unit elements, an insulating film, and a wiring. The plurality of unit elements include a semiconductor layer, a plurality of drain electrodes, gate electrodes, and a source electrode. The semiconductor layer has a first surface. The plurality of drain electrodes are provided on the first surface, respectively. The gate electrodes are provided on or above the first surface around the drain electrodes, respectively. The source electrode is electrically continuously provided across the plurality of unit elements outside the gate electrodes on the first surface and has narrow parts between the gate electrodes which are spaced apart from each other and which belong to adjacent unit elements among the plurality of unit elements. The narrow parts have a width narrower than a width of other parts of the source electrode. The insulating film has openings provided on the source electrode. The insulating film covers the source electrode across the plurality of unit elements. The openings are arranged at the other parts of the source electrode on both sides of each of the narrow parts. The wiring is provided on the insulating film to be connected to the source electrode via the openings so as to be arranged in parallel to each of the narrow parts.

According to another aspect of the present invention, a field-effect transistor includes a plurality of unit elements, an insulating film, and a wiring. The plurality of unit elements include a semiconductor layer, a plurality of drain electrodes, gate electrodes, and a source electrode. The semiconductor layer has a first surface. The plurality of drain electrodes are provided on the first surface, respectively. The gate electrodes are provided on or above the first surface around the drain electrodes, respectively. The source electrode is electrically continuously provided across the plurality of unit elements outside the gate electrodes on the first surface and has narrow parts between the gate electrodes which are spaced apart from each other and which belong to adjacent unit elements among the plurality of unit elements. The narrow parts have a width narrower than a width of other parts of the source electrode. The plurality of drain electrodes are arranged in such a manner that a center of each of the plurality of drain electrodes coincides with a grid point of a triangle grid, the grid point includes a first grid point and a second grid point which are adjacent to each other, and a width of the source electrode positioned on a straight line connecting the first grid point and the second grid point is narrow as compared to the other parts of the source electrode. The insulating film has openings provided on the source electrode. The insulating film covers the source electrode across the plurality of unit elements. The openings are arranged at the other parts of the source electrode on both sides of each of the narrow parts. The wiring is provided on the insulating film to be connected to the source electrode via the openings so as to be arranged in parallel to each of the narrow parts.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
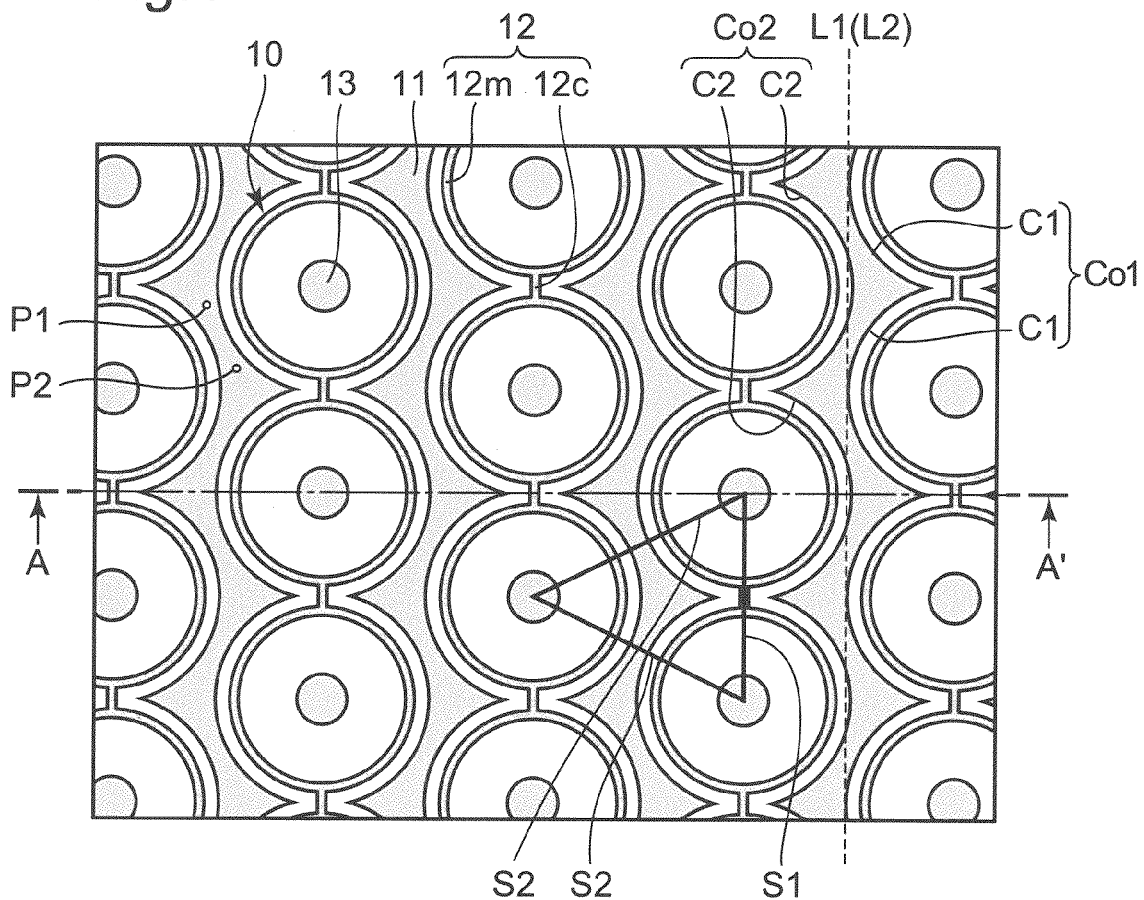
FIG. 1 is a plan view showing an electrode structure of a field-effect transistor according to a first embodiment.

The embodiments will now be described with reference to the accompanying drawings, wherein like reference numerals designate corresponding or identical elements throughout the various drawings.

A field-effect transistor according to embodiments will be described with reference to the accompanying drawings.

Electrode structures of the embodiments can be applied to a field-effect transistor, and can provide the miniaturized field-effect transistor that can achieve the high maximum current.

Electrode structures of embodiments will be described below.

First Embodiment

Figure 2:
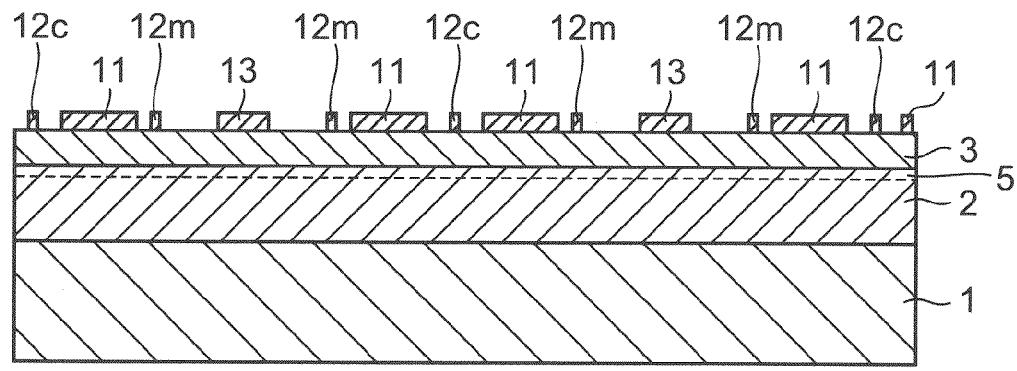
FIG. 2 is a cross-sectional view of the field-effect transistor according to the first embodiment (cross-sectional view taken along the line A-A' of FIG. 1).

FIG. 1 is a plan view showing an electrode structure of a field-effect transistor according to a first embodiment. FIG. 2 is a cross-sectional view of the field-effect transistor of the first embodiment, taken along the line A-A' of FIG. 1. The field-effect transistor of the first embodiment is an example of a GaN-based HEMT to which the electrode structure of the embodiment of the present invention is applied. The field-effect transistor of the first embodiment can provide the miniaturized GaN-based HEMT with the high maximum current. The GaN-based HEMT includes, for example, a substrate 1, an undoped GaN layer 2 formed on or above the substrate 1, and an undoped AlGaN layer 3 formed on or above the undoped GaN layer 2. On the surface of the undoped AlGaN layer, the electrode structure of the embodiment of the present invention is formed. The GaN-based HEMT typically utilizes a two-dimensional electron gas layer (channel) formed near an interface between the undoped GaN layer and the undoped AlGaN layer.

The field-effect transistor of the first embodiment includes a plurality of unit elements, each including a drain electrode 13, a gate electrode 12 formed around the drain electrode 13, and a part of a source electrode 11 disposed outside the gate electrode 12. In the field-effect transistor of the first embodiment, the drain electrode 13, the gate electrode 12, and the source electrode 11 are formed on one surface (first surface) of a semiconductor layer. At the first surface of the semiconductor layer, the drain electrode 13 and the gate electrode 12 are respectively provided for each unit element, and the source electrode 11 is provided outside the gate electrode 12 of each unit element to be shared among the unit elements, and serves as a source electrode in each unit element. The phrase "the drain electrode 13 and the gate electrode 12 are provided for each unit element at the first surface" as used herein means that it is possible to determine and recognize which unit element the drain electrode 13 or gate electrode 12 belongs to in terms of function to serve as the drain or gate electrode. The gate electrodes 12 or the drain electrodes 13 belonging to respective different unit elements may be electrically connected at the first surface or at a surface of an insulating layer formed on the first surface, for example, may be electrically connected via a through hole provided in a semiconductor layer. That is, in the first embodiment, the circular drain electrodes 13 are independently formed on the first surface, and respectively serve as the drain electrode in each unit element. However, for example, the drain electrodes 13 may be electrically connected in another part other than the first surface. The gate electrodes 12 are connected via a gate electrode connection part 12c at the first surface.

A ring-like circular shape gate electrode 12m except for the gate electrode connection part 12c serves as a gate electrode in each unit element. The gate electrode 12m is not shared between the unit elements.

On the other hand, a region of the source electrode 11 which is surrounded by the gate electrodes 12 belonging to the adjacent unit elements serves as the common source electrode shared between the unit elements.

The electrode structure of the field-effect transistor of the first embodiment will be more specifically described below. In the field-effect transistor of the first embodiment, the unit elements are arranged such that the center of each unit element coincides with a grid point of a triangle grid (having a grid in an isosceles triangle with one side S1 and two other sides S2, the one side S1 being slightly shorter than the side S2). Each unit element is formed in a substantially hexagonal region (unit element region) which center is the grid point. That is, in each unit element region, the circular drain electrode 13 is formed with each grid point positioned at its center, and the ring-like gate electrode 12m is formed with a predetermined spacing from the outer periphery of the drain electrode 13. The source electrode 11 is formed in a region outside the gate electrode 12 with another predetermined spacing from the gate electrode 12. In the description below, the circular region inside the source electrode 11 in each unit element region is hereinafter referred to as a "gate and drain electrode formation region 10". The size (radius) of the gate and drain electrode formation region 10 is set such that the adjacent gate and drain electrode formation regions 10 are positioned apart from each other at a predetermined distance on each side S2 of the triangle grid while the adjacent gate and drain electrode formation regions partly are overlapped on each other on the side S1.

As mentioned above, the source electrode 11 formed in each of the regions other than the gate and drain region formation regions 10 is sandwiched between a first outer periphery Co1 and a second outer periphery Co2. The first outer periphery Co1 is formed by by arranging a plurality of substantial semicircles C1 so that the center of each arc of the semicircles C1 is in contact with one straight line L1 and connecting the substantial semicircles C1. The second outer periphery Co2 formed by arranging a plurality of substantial semicircles C2 having the same radius as the substantial semicircle C1 so that the center of each arc of the semicircle C2 in contact with one straight line L2 which is identical or substantially identical to the straight line L1 and connecting the substantial semicircles C2. In the adjacent unit elements, the ring-like gate electrodes 12m adjacent to each other in the direction of the side S1 of the triangle grid are connected together on the first surface.

Thus, the source electrodes 11 formed in the above way are electrically connected between the unit elements on the first surface. Further, the source electrode 11 has a part whose width is narrow between the two gate electrodes 12 spaced apart from each other and belonging to the adjacent unit elements, as compared to other parts thereof. In the first embodiment, for example, the width of the source electrode 11 positioned on the shortest straight line connecting between the gate electrodes 12 belonging to the adjacent unit elements and spaced apart from each other is narrower than that of other parts of the source electrode 11. Thus, this embodiment can reduce restrictions on arranging the gate electrodes 12 due to the shape of the source electrode 11, and further can optimize the electrode structure so as to form more unit elements.

In the field-effect transistor of the first embodiment, as mentioned above, the drain electrodes 13 are arranged in such a manner that the center of each drain electrode coincides with the grid point of the triangle grid, and the width of the source electrode 11 positioned on the straight line connecting the adjacent grid points is narrow as compared to other parts of the source electrode. In this way, the narrowed part of the source electrode 11 is partially provided, which can decrease an area of the source electrode 11 occupying the first surface, while suppressing an increase in resistance of the source electrode 11, thereby optimizing the electrode structure so as to form more unit elements 11.

Accordingly, the electrode structure of the field-effect transistor of the first embodiment can maximize the channel area, while keeping a low resistance of the wiring of the source electrode, thereby producing the miniaturized field-effect transistor with the high maximum current. The suppression of an increase in resistance of the wiring will be described in detail below.

In the above-mentioned electrode structure of the field-effect transistor according to the first embodiment, for example, a current route is preferably provided in parallel with a narrowed part of the source electrode 11, which can decrease a wiring resistance of the source electrode. For example, an insulating film is formed on the first surface of the semiconductor layer. For example, a source wiring (source wire) connecting between points P1 and P2 shown in FIG. 1 is formed on the insulating film. In this way, the current route is formed in parallel with the part with the minimum width (minimum width portion), which suppresses the increase in wiring resistance. Even when the minimum width of the source electrode 11 is decreased, the source wiring with a larger width can effectively suppress the increase in wiring resistance. Thus, when the current route is provided in parallel with the narrowed part of the source electrode 11 in the electrode structure of the field-effect transistor of the first embodiment, an area occupied by the source electrode 11 can be further decreased, resulting in an increase of the channel area. In FIG. 1, the points P1 and P2 are illustrated only on both sides of one minimum width portion. However, actually, the current route is formed of the source wiring in parallel with all minimum width portions.

In the electrode structure for connecting between the points P1 and P2 by the source wiring on the insulating film, the connection part (minimum width part) of the source electrode 11 on the first surface serves as a backup route of the current path formed of the source wiring, which can ensure good conduction between the adjacent source electrodes 11. That is, when the source electrodes are separately formed on the first surface for the respective unit elements, normally, the adjacent source electrodes are connected together only via the source wiring. In this case, when the contact resistance (connection resistance) between a part of the source electrode and the source wiring becomes higher due to the failure of connection, the current is less likely to flow through the part of the source electrode. However, in this embodiment, the source electrodes 11 are electrically connected across the unit elements on the first surface. Thus, even when the contact resistance between the part of the source electrode and the source wiring becomes high, the connection part of the source electrode 11 on the first surface serves as a backup route, which can ensure the good conduction to the source electrode via the connection part. In the first embodiment, the term "connection part" as used herein means a part on a straight line connecting adjacent grid points.

The source electrode 11 is formed to have a constant distance from the gate electrode 12 provided in each unit element. Thus, the shape of the source electrode 11 is determined based on the arrangement of the adjacent gate electrodes. As a result, the source electrode 11 does not have a constant width, and thus has such a shape as to have different widths depending on the position of the gate electrode. Specifically, the source electrode 11 has a narrow-width region (narrow part) as compared to other parts of the source electrode. In this first embodiment, for example, as shown in FIG. 1, the narrow-width regions (narrow parts) and wide-width regions (above-mentioned other parts than the narrow parts) are alternately arranged. Thus, in order to form the source electrode 11 with the wide-width and narrow-width regions alternately arranged, the contact portion with the source wiring is preferably formed in each of the wide-width regions, which can surely ensure the stable electrical contact between the source wiring and the source electrode 11, resulting in a low contact resistance. Here, the term "narrow part" as used in the first embodiment means a region including the connection part and its surroundings.

In the structure of the source electrodes 11 shown in FIG. 1, as the number of unit elements is increased, the narrow-width region with a high resistance is expanded, which tends to increase the resistance of the electrode structure as a whole. However, in the structure of this embodiment, the current route is provided in parallel with the narrow parts of the source electrodes 11, which can decrease the resistance of the source electrode 11. As a result, this embodiment can increase the number of unit elements without increasing the resistance of the source electrode 11. In other words, the provision of the current route in parallel with the narrow part of the source electrode 11 can decrease the width of the minimum-width part of the source electrode 11, for example, to 10 µm or less, thereby reducing the distance between the adjacent unit elements to increase the number of available unit elements. The width of the minimum-width part of the source electrode 11 is preferably 0.1 µm or more.

In the structure of this embodiment, the formation of the current flow path in parallel with the narrowed part (narrow part) of the source electrode 11 can produce the source electrodes with a low resistance as compared to the case of scattering source electrodes separated from each other at the first surface.

Specific embodiment of the source wiring will be described below with reference to FIGS. 3 and 4.

Figure 3:
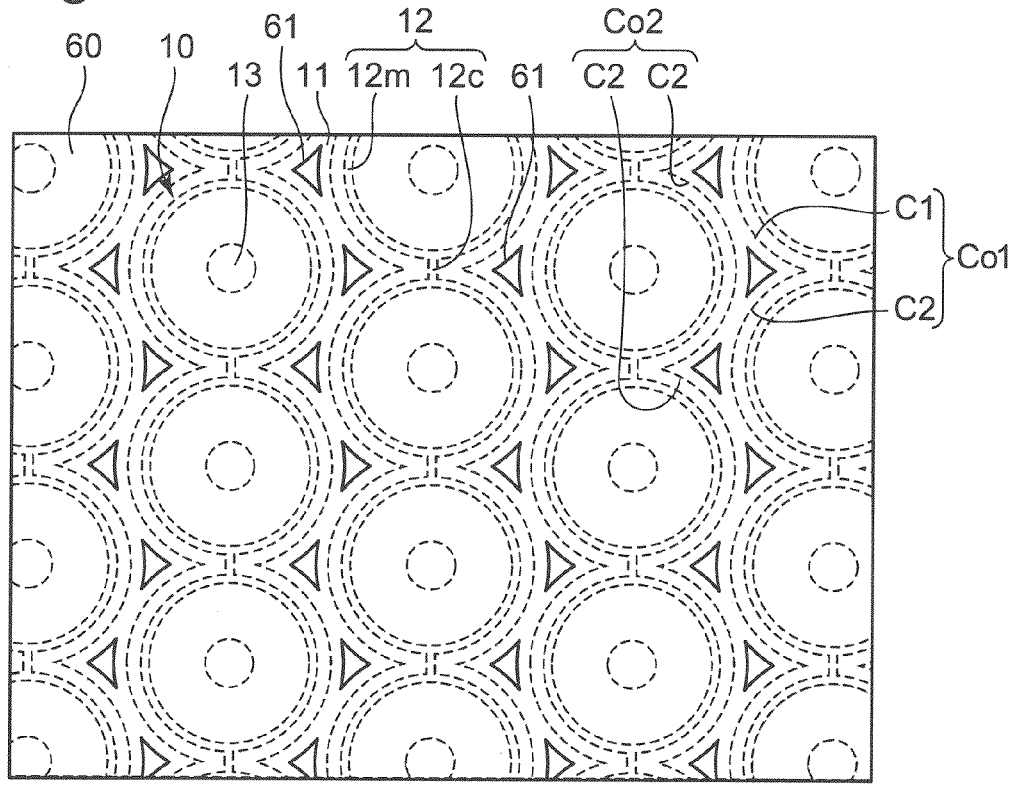
FIG. 3 is a plan view showing the structure of an insulating film 60 formed on a first surface of a semiconductor layer in the field-effect transistor according to the first embodiment.
Figure 4:
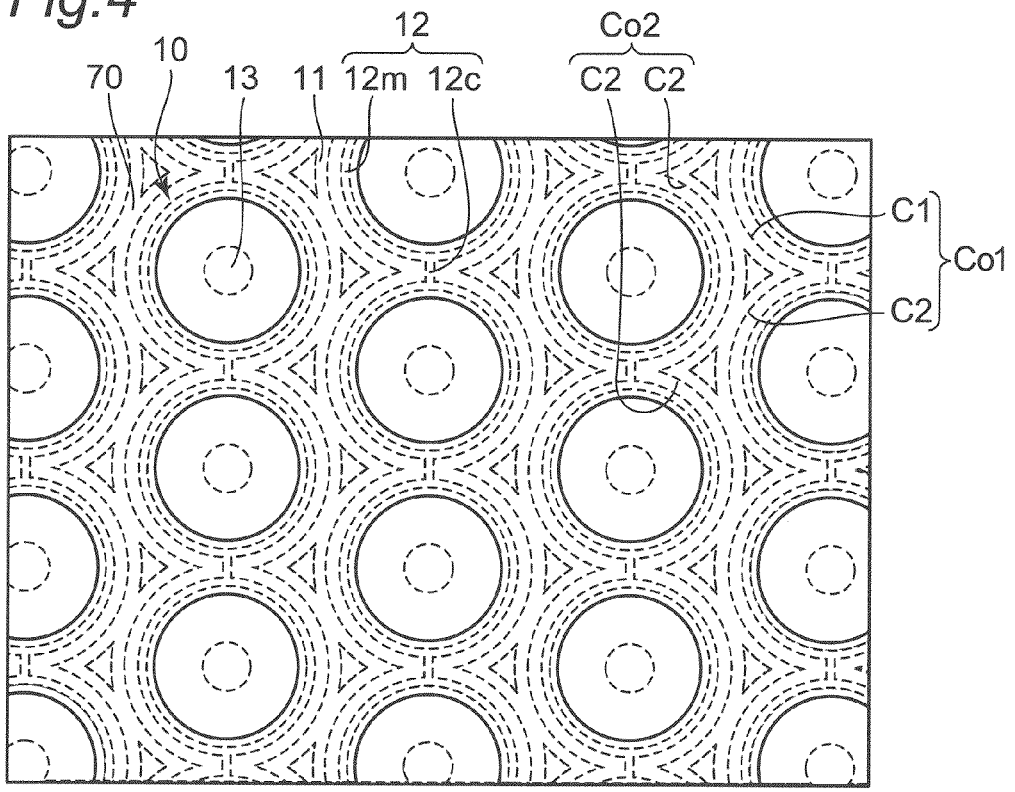
FIG. 4 is a plan view showing the structure of source wirings 70 formed on an insulating film 60 in the field-effect transistor of the first embodiment.

In the field-effect transistor according to the first embodiment, as shown in FIG. 3, an insulating film 60 which has openings 61 at the wide-width regions of the source electrode 11 covers the source electrodes 11, the drain electrodes 13, the gate electrodes 12, and the semiconductor layer except for the openings 61. Thus, parts of the surface of the source electrode 11 are exposed from the inside of the opening 61. The openings 61 are formed in the wide-width regions of the source electrode 11, which can relatively increase an aria of the source electrode 11 exposed by each of the openings, thus easily ensuring the contact area required to decrease a contact resistance between the source wiring 70 and the source electrode 11.

The source wiring 70 is formed to be connected to the source electrodes 11 via the respective openings 61, and to establish electrical conduction between the adjacent source electrodes exposed from the openings 61. In this first embodiment, the source wiring 70 is integrally formed with the entire region except for an upper part of the drain region 13 inside the gate electrode 12m.

In this first embodiment, a range where the source wring 70 is not formed is set, for example, to cover a region directly above the drain region 13. Preferably, as shown in FIG. 4, the range is set by a circle which is a concentric circle sharing the center with the circular drain electrode 13 and having a larger radium than that of the drain electrode 13 inside the gate electrode 12m. In this way, a second insulating film is formed to cover the source wiring 70, so that a drain wiring for connecting the adjacent drain electrodes 13 can be formed on the second insulating film. For example, openings are formed to penetrate the insulating film 60 and the second insulating film, exposing the drain electrodes 13 therefrom. The drain wiring for connecting the drain electrodes 13 exposed via the openings is formed on the second insulating film. This arrangement does not need to form the source wiring for connecting the source electrodes 11 on the first surface of the semiconductor layer, and also does not need to connect the drain wiring for connecting the drain electrodes 13 on the first surface of the semiconductor layer, which can form more unit elements on the first surface.

In the electrode structure of the field-effect transistor of this first embodiment, the outer periphery of the ring-like gate electrode 12m is geometrically similar to the inner periphery of the gate and drain electrode formation region 10, and further the inner periphery of the ring-like gate electrode 12m has the shape geometrically similar to that of the outer periphery of the drain electrode 13, which can keep the distance between the electrodes constant in any position to form a channel with a large width along the inner and outer peripheries of the ring-like gate electrode 12m.

In this embodiment and other embodiments, the source electrode and the drain electrode can be replaced by each other. From the viewpoint of improving the withstand voltage, as shown in FIG. 1, preferably, the drain electrode is positioned inside the gate electrode and the distance between the gate electrode and the drain electrode is larger than that between the gate electrode and the source electrode. For example, the distance between the gate electrode and the drain electrode can be preferably in a range of 1 to 50 μm, and more preferably 5 to 20 μm.

Second Embodiment

Figure 5:
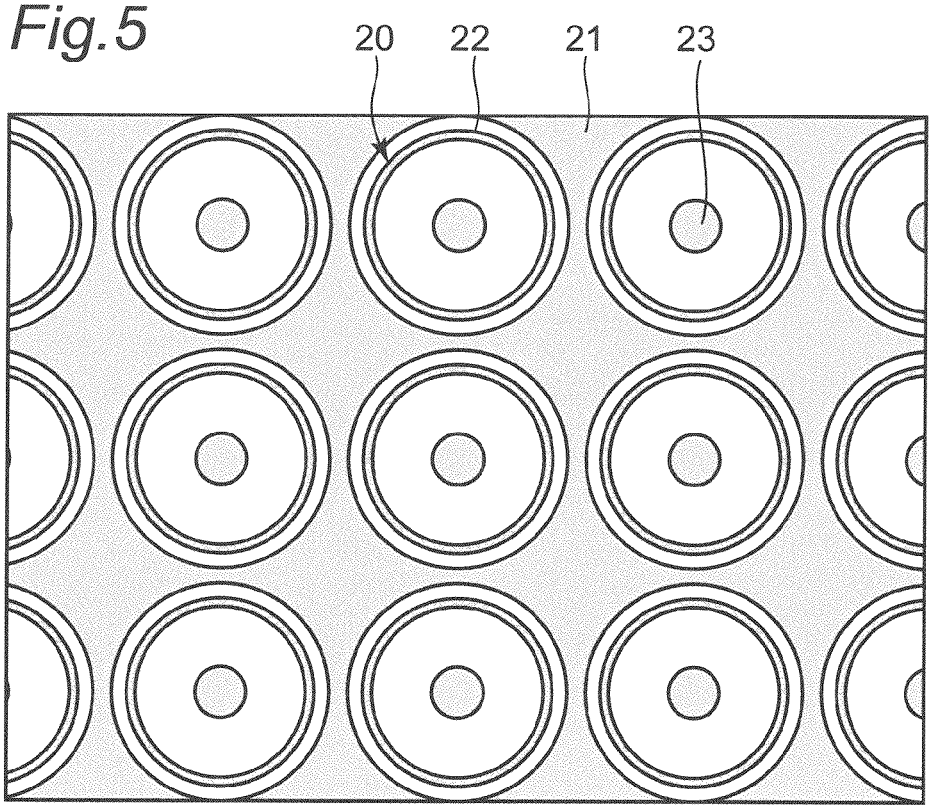
FIG. 5 is a plan view showing an electrode structure of a field-effect transistor according to a second embodiment.

FIG. 5 shows a plan view of an electrode structure of a field-effect transistor according to a second embodiment.

The field-effect transistor of the second embodiment is basically the same as that of the first embodiment except for the arrangement (array) of unit elements and the shape of the source electrode 21.

In other words, the second embodiment is the same as the first embodiment in that the field-effect transistor includes a plurality of unit elements, but differs from the first embodiment in that the respective centers of the unit elements coincide with grid points of a square grid.

The adjacent gate and drain electrode formation regions 20 are spaced apart from each other by a predetermined distance, and separated by the source electrode 21.

With the differences mentioned above, the source electrodes 21 have such a shape that one common region shared among four unit elements and surrounded by four gate and drain electrode formation regions 20 (shape formed by connecting four arcs as one fourth of a circle with a radium R via a connection part) is connected to another common region via a connection part (in the second embodiment, the connection part as used herein means a part on the straight line connecting the adjacent grid points).

The shape and arrangement of the ring-like part of each of the gate electrodes 22 and the drain electrodes 23 are the same as in the first embodiment. In this embodiment, the gate electrodes 22 of the adjacent unit elements are separated from each other on the first surface. This differs from the first embodiment in which the gate electrodes 12 of the adjacent unit elements are connected together in a specific direction.

Even in the electrode structure of the field-effect transistor configured in the above way according to the second embodiment, the source electrodes 21 are electrically connected between the unit elements on the first surface. Further, the source electrode 21 has a part whose width is narrow between the two gate electrodes 12 spaced apart from each other and belonging to the adjacent unit elements as compared to other parts thereof. Thus, this embodiment can reduce restrictions on arranging the gate electrodes 12 due to the shape of the source electrode 21, thereby optimizing the electrode structure so as to form more unit elements.

In the field-effect transistor of the second embodiment, as mentioned above, the drain electrodes 23 are arranged in such a manner that the center of each drain electrode coincides with the grid point of the square grid, and the width of the source electrode 21 positioned on the straight line connecting the adjacent grid points is narrow as compared to other parts of the source electrode. In this way, the narrowed part of the source electrode 21 is partially provided, which can decrease an area of the source electrode 21 occupying the first surface, while suppressing an increase in resistance of the source electrode 21, thereby optimizing the electrode structure so as to form more unit elements 11.

Accordingly, the electrode structure of the field-effect transistor of the second embodiment can maximize the channel area, while keeping a low resistance of the wiring of the source electrode, thereby providing the miniaturized field-effect transistor with the high maximum current.

In the above-mentioned electrode structure of the field-effect transistor according to the second embodiment, for example, a current route formed of the source wiring is provided in parallel with a narrowed part of the source electrode 21, which can decrease a wiring resistance of the source electrode. In this case, the connection part of the source electrode 21 on the first surface can serve as a backup route for the current route formed of the source wiring to ensure the good conduction to the source electrode 11.

In the second embodiment, like the first embodiment, as shown in FIG. 5, the narrow-width regions (narrow parts) and the wide-width regions (other parts than narrow parts) are alternately arranged in the source electrode 21. In this way, when the source electrode 21 is formed in a shape with the wide-width and narrow-width regions alternately arranged, the contact portion with the source wiring is preferably formed in each of the wide-width regions, which can surely establish the stable electrical contact between the source wiring and the source electrode 21, resulting in a low contact resistance. Here, the term "narrow part" as used in the second embodiment means a region covering the connection part and its surroundings, like the first embodiment.

In the electrode structure of the field-effect transistor of the second embodiment, the outer periphery of the gate electrode 22 is geometrically similar to the inner periphery of the gate and drain electrode formation region 20, and further the inner periphery of the gate electrode 22 has the shape geometrically similar to that of the outer periphery of the drain electrode 23, which can keep the distance between the electrodes constant in any position to form a channel with a large width along the inner and outer peripheries of the gate electrode 22. The second embodiment is the same as the first embodiment in that the gate electrodes 22 or drain electrodes 23 may be electrically connected on the first surface or at the surface of the insulating layer formed on the first surface, and so are the following embodiments.

Third Embodiment

Figure 6:
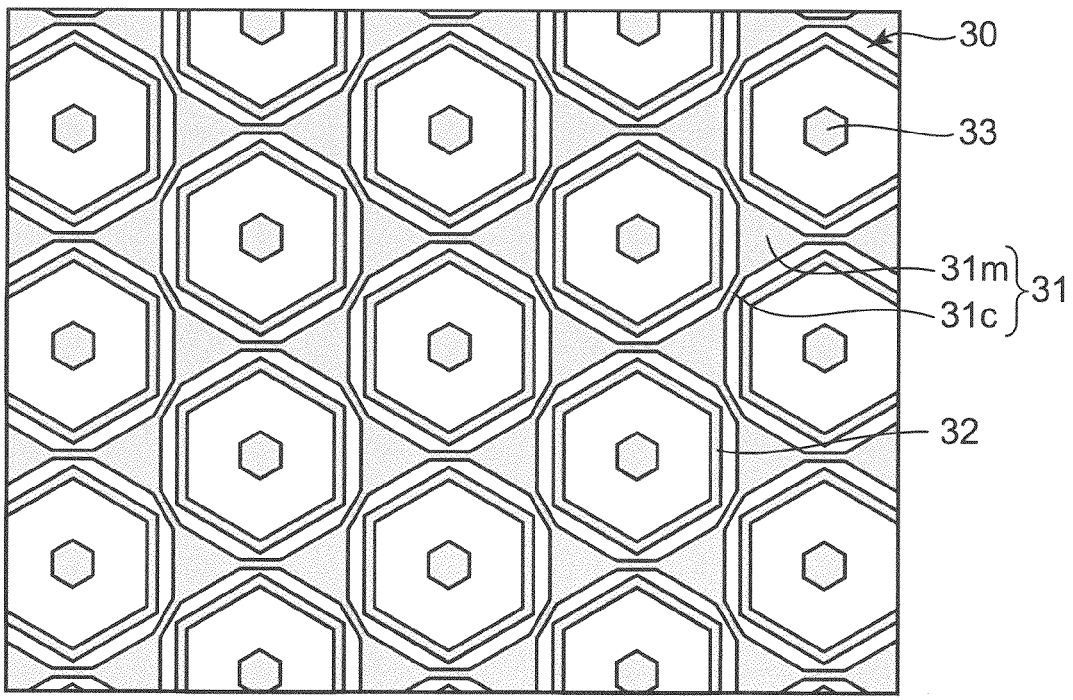
FIG. 6 is a plan view showing an electrode structure of a field-effect transistor according to a third embodiment.

FIG. 6 shows a plan view of an electrode structure of a field-effect transistor according to a third embodiment.

In the field-effect transistor of the third embodiment, the centers of the unit elements are arranged to be coincided with grid points of the equilateral triangle. Each unit element includes a gate electrode 32 and a drain electrode 33 which are formed in a hexagonal shape at the gate and drain electrode formation region 30 with a dodecagonal shape formed by chamfering the edges of the regular hexagon, and a source electrode 31 positioned outside the gate electrode 32. In the third embodiment, the size of the dodecagonal shape is set such that one side formed by chamfering the gate and drain electrode formation region 30 is positioned in parallel and close to another side formed by chamfering of adjacent gate and drain electrode formation region 30. The source electrode 31 is formed in a region other than the gate and drain electrode formation region 30. In the field-effect transistor of the third embodiment with the above-mentioned structure, the source electrode 31 has such a shape that a plurality of triangle common regions are connected together via respective connection parts. That is, the source electrode 31 is formed to have such a shape that one common region 31m shared among three unit elements and surrounded by three gate and drain electrode formation regions 30 is coupled to another common region via a connection part 31c (in this embodiment, the connection part as used herein means a narrow part as a part having a narrower width than other parts and located on the straight line connecting the adjacent grid points). The gate electrode 32 is formed in a ring-like hexagonal shape (regular hexagonal shape) in a position spaced apart from the outer periphery of the gate and drain electrode formation region 30 by a predetermined distance within the gate drain electrode region 30. The drain electrode 33 is also formed in a hexagonal shape (regular hexagonal shape) in a position spaced apart from the gate electrode 32 by another predetermined distance within the gate electrode 32. The gate electrode 32 and the drain electrode 33 are formed to be separated from each other on the first surface in the adjacent unit elements, but may be connected together via a source wiring formed, for example, on the insulating film formed on the surface of the semiconductor layer.

In the electrode structure of the field-effect transistor configured in the above way according to the third embodiment, the source electrodes 31 are electrically connected between the unit elements on the first surface. Further, the source electrode 31 has a part (narrow part) whose width is narrow between the two gate electrodes 32 spaced apart from each other and belonging to the adjacent unit elements, as compared to other parts thereof. Thus, this embodiment can reduce restrictions on arranging the gate electrodes 12 due to the shape of the source electrode 31, thereby optimizing the electrode structure so as to form more unit elements. The term "constant distance" as used herein does not mean that the distance is completely constant, but means that the distance can be substantially constant. Accordingly, like the third embodiment, the term "constant distance" includes the case in which a distance between the gate electrode 32 and one side formed by chamfering the gate and drain electrode formation region 30 is partly small.

Accordingly, the electrode structure of the field-effect transistor of the third embodiment can maximize the channel area, while keeping a low resistance of the wiring of the source electrode, thereby producing the miniaturized field-effect transistor with the high maximum current.

In the above-mentioned electrode structure of the field-effect transistor in the third embodiment, for example, a current route is provided via the source wiring formed on the insulating film in parallel with a connection part 31c of the source electrode 31, which can decrease a wiring resistance on the source electrode side.

In this case, the connection part 31c of the source electrode 31 on the first surface can serve as a backup route for the current route formed of the source wiring to ensure the good conduction between the adjacent source electrodes 31.

Further, in this third embodiment, the contact portion with the source wiring is preferably formed in the wide-width common region 31m, which can surely establish the stable electrical contact between the source wiring and the source electrode 31, resulting in a low contact resistance.

Fourth Embodiment

Figure 7A:
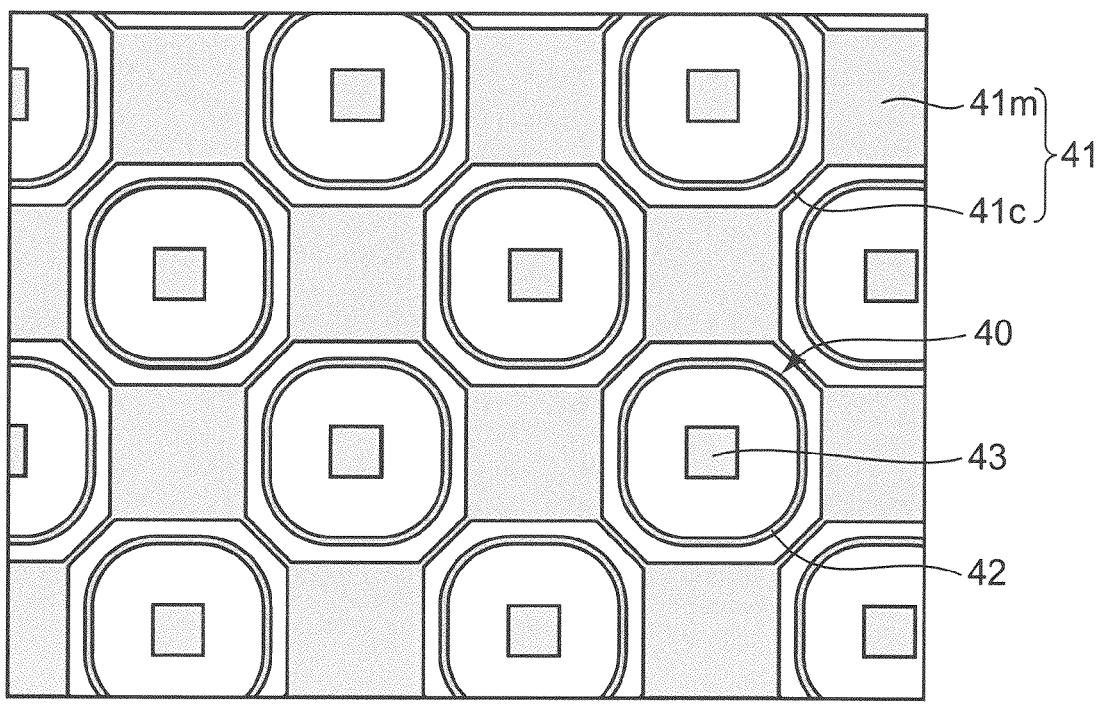
FIG. 7A is a plan view showing an electrode structure of a field-effect transistor according to a fourth embodiment.
Figure 7B:
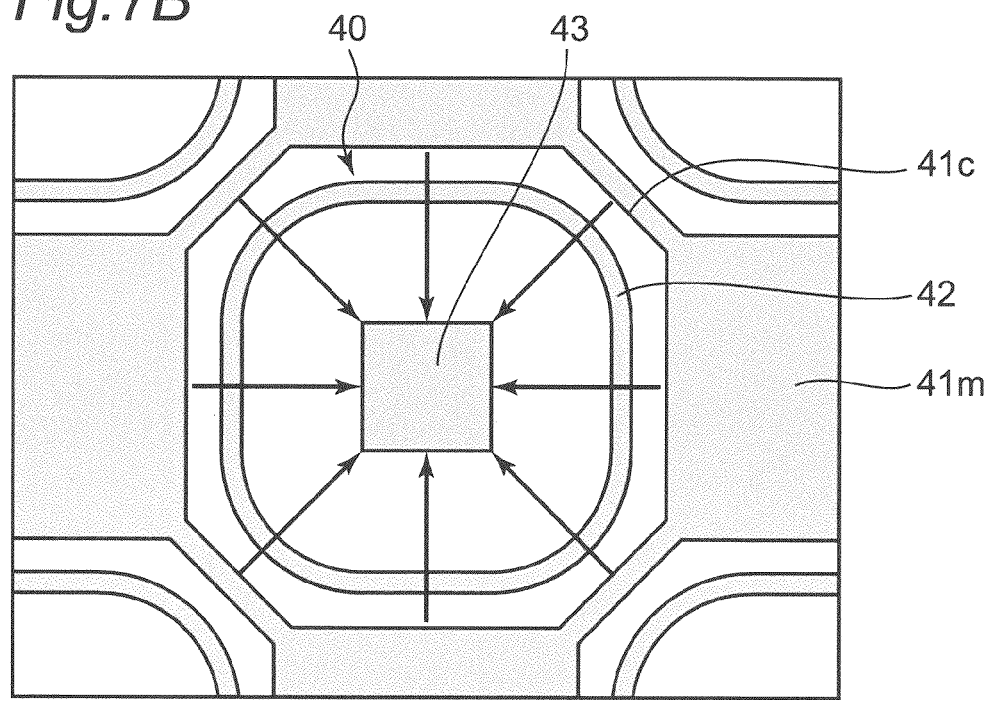
FIG. 7B is an enlarged plan view of apart of FIG. 7A, showing a gate and drain electrode formation region 40 of one unit element.

FIG. 7A shows a plan view of an electrode structure of a field-effect transistor according to a fourth embodiment, and FIG. 7B is an enlarged plan view of a part of FIG. 7A, showing a gate and drain electrode formation region 40 of one unit element.

In the field-effect transistor of the fourth embodiment, the centers of the unit elements are arranged to be coincided with the grid points of the square grid. The gate and drain electrode formation region 40 corresponding to the unit element of the fourth embodiment has an octagonal shape formed by chamfering the corners of a square. Assuming that the gate and drain electrode formation region has a square shape not chamfered, the length of one side of the square is set so that a part of the corner of the square overlaps with a part of a corner of another adjacent assumed square shape when the center of the region 40 is arranged to be coincided with the grid point of the square grid. That is, in the field-effect transistor of the fourth embodiment, a part of four corners of the assumed square of the gate and drain electrode formation region 40 is connected to the assumed square of the adjacent gate drain electrode formation region 40. In the position where the assumed square is chamfered, the source electrode 41 is formed. Further, the source electrode 41 is formed in a region other than the gate and drain electrode formation region 40. In the field-effect transistor of the fourth embodiment with the above-mentioned structure, the source electrode 41 has such a shape that a plurality of square common regions 41m are connected together via respective connection parts 41c. That is, the source electrode 41 is formed to have such a shape that one common region 41m shared among four unit elements and enclosed by four gate and drain electrode formation regions 40 is coupled to another common region via a connection part 41c (in this embodiment, the connection part as used herein meaning a narrow part as a part having a narrower width than other parts and located on the straight line connecting the adjacent grid points). The gate electrode 42 is formed in a ring-like quadrilateral shape with its corners rounded in a position spaced apart from the outer periphery of the gate and drain electrode formation region 40 by a predetermined distance within the gate and drain electrode formation region 40. The drain electrode 43 is also formed in a square (quadrilateral) shape in a position spaced apart from the gate electrode 42 by another predetermined distance within the gate electrode 42. In this way, preferably, the inner periphery of the gate electrode 42 has a substantially geometrically similar shape as the outer periphery of the drain electrode 43, which can set the distance between these electrodes substantially constant in any position. Likewise, the outer periphery of the gate electrode 42 has the substantially geometrically similar shape to the inner periphery of the gate and drain electrode formation region 40. In this way, in the electrode structure of the field-effect transistor of the fourth embodiment, the outer periphery of the gate electrode 42 is substantially geometrically similar to the inner periphery of the gate and drain electrode formation region 40, and further the inner periphery of the gate electrode 42 has the shape substantially geometrically similar to that of the outer periphery of the drain electrode 43, which can keep the distance between the electrodes constant in any position to form a channel with a large width along the inner and outer peripheries of the gate electrode 42. The gate electrode 42 and the drain electrode 43 are formed to be separated from each other on the first surface in the adjacent unit elements, but may be connected together via a wiring electrode (source wiring) formed on the insulating film formed on the surface of the semiconductor layer.

In the electrode structure of the field-effect transistor configured in the above way according to the fourth embodiment, the source electrodes 41 are electrically connected between the unit elements on the first surface. Further, the source electrode 41 has a part whose width is narrow between the two gate electrodes 42 spaced apart from each other and belonging to the adjacent unit elements as compared to other parts thereof. Thus, this embodiment can reduce restrictions on arranging the gate electrodes 42 due to the shape of the source electrode 41, thereby optimizing the electrode structure so as to form more unit elements.

Accordingly, the electrode structure of the field-effect transistor according to the fourth embodiment can maximize the channel area, while keeping a low resistance of the wiring of the source electrode, thereby producing the miniaturized field-effect transistor with the high maximum current.

In the above-mentioned electrode structure of the field-effect transistor according to the fourth embodiment, for example, a current route is provided via the wiring electrode formed of the insulating film in parallel with a connection part 41c on the source electrode 41, which can decrease a wiring resistance of the source electrode.

In this case, the connection part 41c of the source electrode 41 on the first surface can serve as a backup route for the current route formed of the source wiring to ensure the good conduction between the adjacent source electrodes 41.

Further, in this fourth embodiment, the contact portion with the source wiring is preferably formed in the wide-width common region 41m, which can surely establish the stable electrical contact between the source wiring and the source electrode 41, resulting in a low contact resistance.

Fifth Embodiment

Figure 8A:
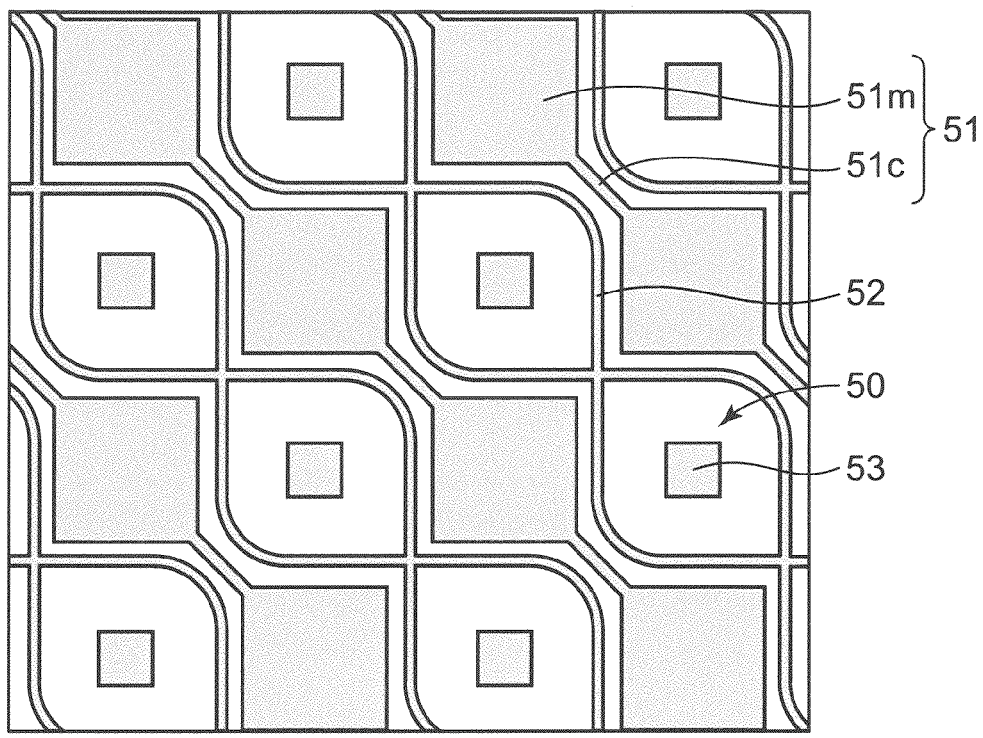
FIG. 8A is a plan view showing an electrode structure on a first surface of a semiconductor layer of a field-effect transistor according to a fifth embodiment.
Figure 8B:
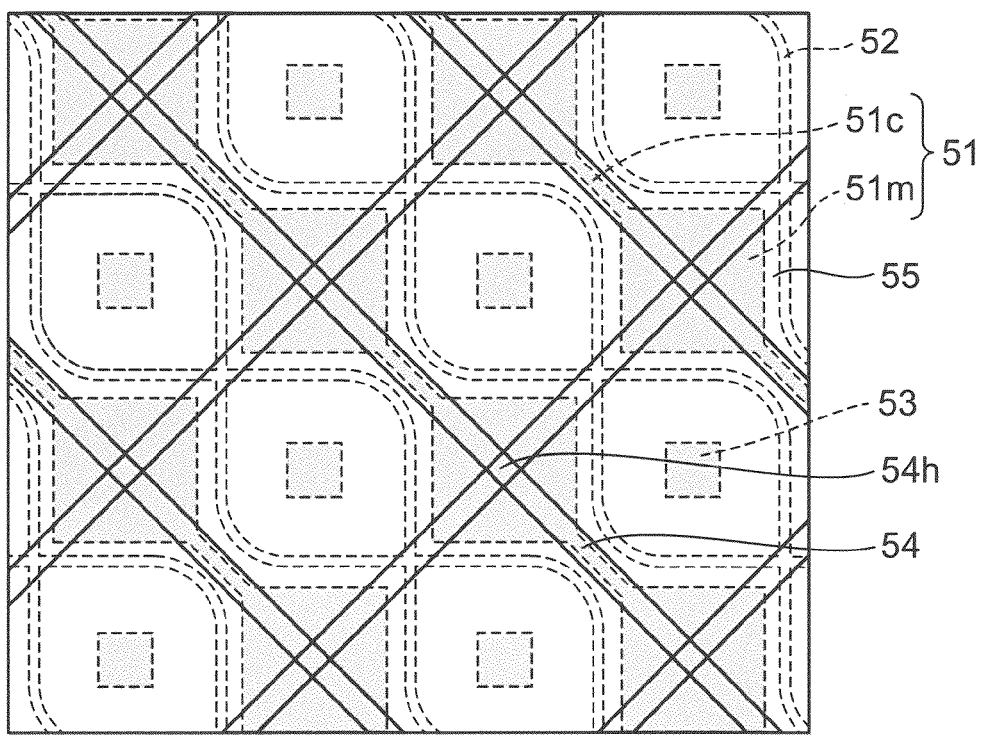
FIG. 8B is a plan view showing a source wiring structure in which source electrodes formed on the first surface is formed on an insulating film in the field-effect transistor of the fifth embodiment.

FIG. 8A shows a plan view of an electrode structure on a first surface in a semiconductor layer of a field-effect transistor according to a fifth embodiment. FIG. 8B shows a plan view of a source wiring structure in which source electrodes formed on the first surface is formed on an insulating film in the field-effect transistor of the fifth embodiment.

In the field-effect transistor of the fifth embodiment, the setting of a gate and drain electrode formation region 50 on the first surface of the semiconductor layer and the structure of the drain electrode 53 on the first surface of the semiconductor layer are the same as those of the fourth embodiment.

That is, in the field-effect transistor of the fifth embodiment, the centers of the unit elements are coincided with grid points of a square grid, the gate and drain electrode formation region 50 corresponding to the unit element has a square shape with a pair of corners thereof on one diagonal line of the square chamfered, and another pair of corners not chamfered of the gate and drain electrode formation region 50 are overlapped with a corner of the adjacent gate and drain electrode formation region 50.

The source electrode 51 is formed in a region other than the gate and drain electrode formation region 50. The source electrode 51 has such a shape that square common regions 51m are connected together via the connection parts 51c disposed at the chamfered parts of the gate and drain electrode formation region 50. The common regions 51m arranged in the direction along one diagonal line of the common region 51m are connected together by the connection parts 51c, whereas other common regions 51m arranged in the direction along the other diagonal line are not connected together, which is different from the fourth embodiment.

The gate electrode 52 is formed in a substantially square ring-like shape in a position spaced apart inward from the outer periphery of the gate and drain electrode formation region 40 by a predetermined distance. Referring to FIG. 8A, the field-effect transistor of the fifth embodiment differs from the field-effect transistor of the fourth embodiment in that the adjacent gate electrodes 52 arranged in the direction along one diagonal line are coupled together, which differs from the field-effect transistor of the fourth embodiment. The drain electrode 53 is formed in a square shape in a position spaced apart from the gate electrode 52 by a predetermined distance on the inner side of the gate electrode 52. The drain electrodes 53 are separated from each other in the adjacent unit elements on the first surface. However, the drain electrodes 53 may be connected together, for example, via a wiring electrode formed on the insulating film formed on the surface of the semiconductor layer.

In this case, the connection part 51c of the source electrode 51m on the first surface can serve as a backup route for the current route formed of the source wiring to ensure the good conduction between the adjacent source electrodes 51m.

A source wiring 54 is connected in parallel with the source electrode 51 at a surface different from the first surface of the semiconductor layer in order to decrease the wiring resistance of the source electrode 51. In the fifth embodiment, as shown in FIG. 8B, the source wirings 54 are formed in a grid pattern at the surface of an insulating film 55 formed on the first surface of the semiconductor layer. The source wiring 54 is connected to the center of the common region 51m of the source region 51 via a through hole (opening) 54h formed in the insulating film 55 at the connection part as an intersection of the grid pattern (a part corresponding to the grid point of the grid pattern) of the source wiring 54. That is, the through hole 54h is formed directly above the center of the common region 51m.

Figure 8C:
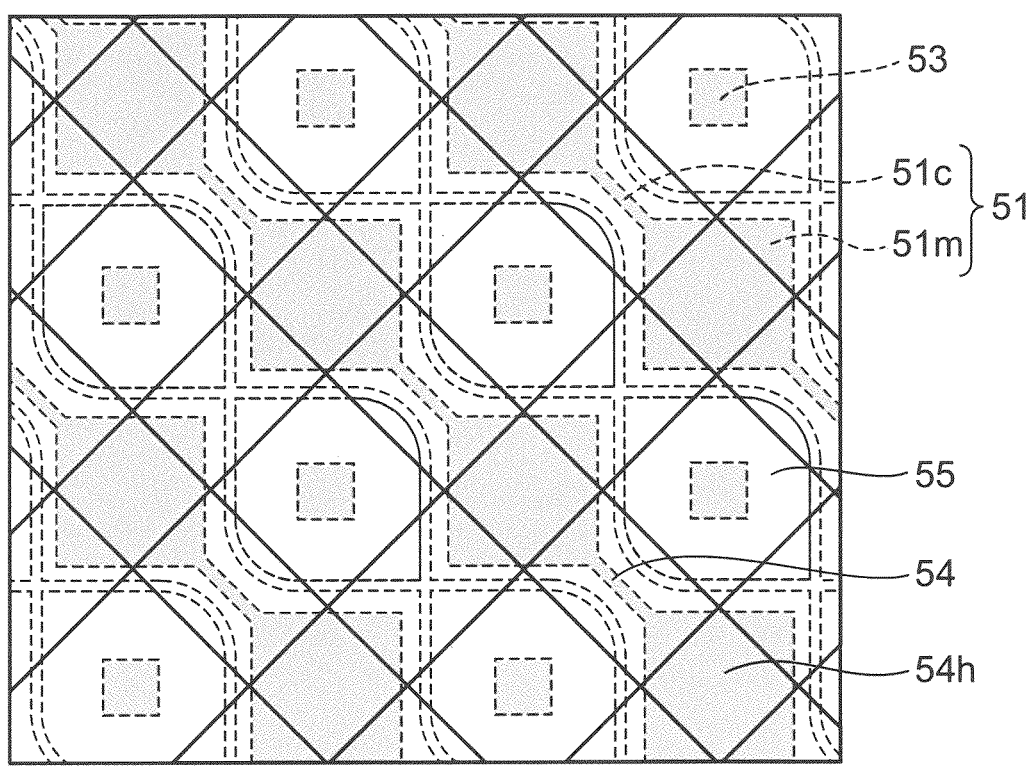
FIG. 8C is a plan view showing a source wiring structure in which source electrodes formed on the first surface is formed on an insulating film in the field-effect transistor of a modification of the fifth embodiment.

As shown in FIG. 8C, the source wiring 54 may be widened in order to further decrease the wiring resistance of the source electrode 51.

In the electrode structure of the field-effect transistor configured in the above way according to the fifth embodiment, the source electrodes 51 are electrically connected across the unit elements on the first surface. Further, the source electrode 51 has a part whose width is narrow between the two gate electrodes 52 spaced apart from each other and belonging to the adjacent unit elements as compared to other parts thereof. Thus, this embodiment can reduce restrictions on arranging the gate electrodes 52 due to the shape of the source electrode 51, thereby optimizing the electrode structure so as to form more unit elements.

Further, in the fifth embodiment, the contact portion with the source wiring 54 is preferably formed in each of the wide-width common regions 51m in the fifth embodiment, which can surely establish the stable electrical contact between the source wiring 54 and the source electrode 51, resulting in a low contact resistance.

Accordingly, the electrode structure of the field-effect transistor according to the fifth embodiment can maximize the channel area, while keeping a low wiring resistance of the source electrode, thereby providing the miniaturized field-effect transistor with the high maximum current.

Further, the wiring resistance of the source electrode can be decreased.

In the electrode structure of the field-effect transistor according to each of the first to fifth embodiments mentioned above, the source electrodes are electrically connected together among the unit elements on the first surface of the semiconductor layer, so that the source electrodes can surround the gate electrodes as a whole, which can increase the channel area, thereby providing the miniaturized field-effect transistor with the high maximum current.

Figure 10:
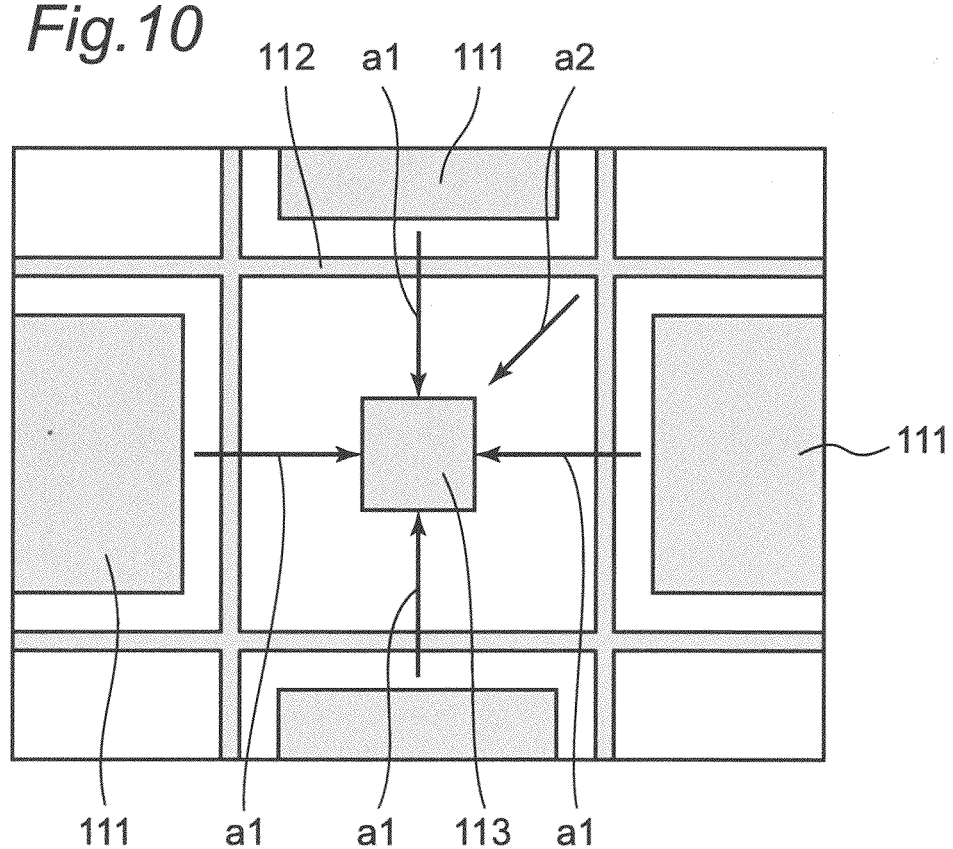
FIG. 10 is a plan view showing an example of a conventional field-effect transistor including an electrode structure with drain electrodes arranged in an island-like manner.

That is, as shown in Comparative Example of FIG. 10, when the source electrodes 111 are separated from each other on the first surface of the semiconductor layer, current flows in the direction indicated by the arrows a1. In contrast, current hardly flows in the direction indicated by the arrow a2 in which the source electrodes 111 are separated. Even though the current flows in the direction a2, a current route becomes a bypass one, which increases the resistance. As a result, only a little current flows in the direction a2.

However, for example, as shown in FIG. 7B, the source electrodes are positioned to surround the gate electrode as a whole, so that current can flow in all directions indicated by the arrows illustrated, which can further increase the channel area, thereby providing the more miniaturized field-effect transistor with the higher maximum current.

In FIG. 10, the numeral 113 refers a drain electrode, and the numeral 112 refers a gate electrodes 112.

EXAMPLES

In Example 1, a field-effect transistor with the electrode structure of the first embodiment shown in FIG. 1 was manufactured. The field-effect transistor of Example 1 is a GaN-based HEMT. A sapphire substrate was used as a substrate 1. An undoped GaN layer 2 of 0.5 µm in thickness, an AlN layer of 0.9 nm in thickness, and an undoped AlGaN layer 3 of 7 nm in thickness were stacked on the substrate 1 in that order to form the gate electrodes 12, the drain electrodes 13, and the source electrode 11 with a structure to be described in detail below, thereby producing the electrode structure of the field-effect transistor.

Figure 9A:
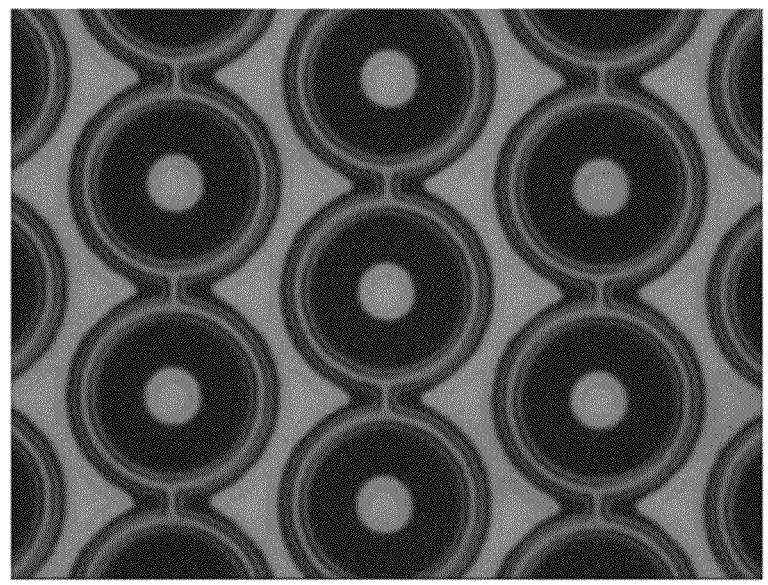
FIG. 9A is a photograph as a substitute for a drawing showing an electrode structure of a field-effect transistor of Example 1.

The electrode structure of the manufactured field-effect transistor is shown in FIG. 9A.

In Example 1, an isosceles triangle grid defining the arrangement of unit elements arranged in a regular pattern had a side S1 of 25 µm, and two sides S2 of 28 µm. The diameter of the gate and drain electrode formation region 10 was set such that an inner diameter of the ring-like gate electrode 12m was 20 µm. Distances (intervals) between respective electrodes were as follows:

distance between the source electrode and gate electrode: 2 µm;

gate length (width of gate electrode): 1 µm; and distance between the gate electrode and drain electrode: 7 µm.

In the way mentioned above, as shown in FIG. 9B, the field-effect transistor of Example 1 was formed to include 1580 unit elements (each unit element covering one drain electrode and its surroundings) in a range of 1 mm square on the first surface of the semiconductor layer.

Figure 9B:
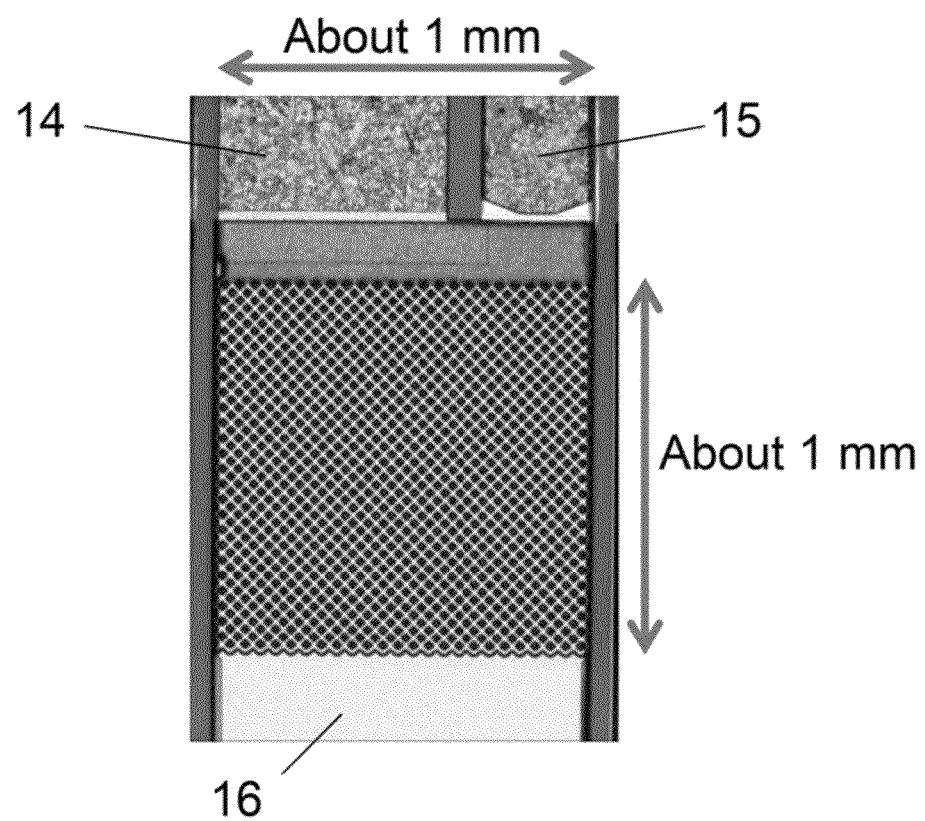
FIG. 9B is a photograph as a substitute for a drawing showing an arrangement of unit elements in a field-effect transistor of Example 1.

The drain electrodes in the adjacent unit elements were connected together by Au plating via the insulating film. Likewise, the source electrodes were also connected together by Au plating via the insulating film. As shown in FIG. 9B, feed portions 14, 15, and 16 electrically connected to the respective electrodes were formed outside the element region. Specifically, via wires or the like, the feed portion 14 of the source electrodes was connected to the source electrode, the feed portion 15 of the gate electrodes was connected to the gate electrode, and the feed portion 16 of the drain electrodes was connected to the drain electrode, whereby power was fed to the electrodes.

Figure 9C:
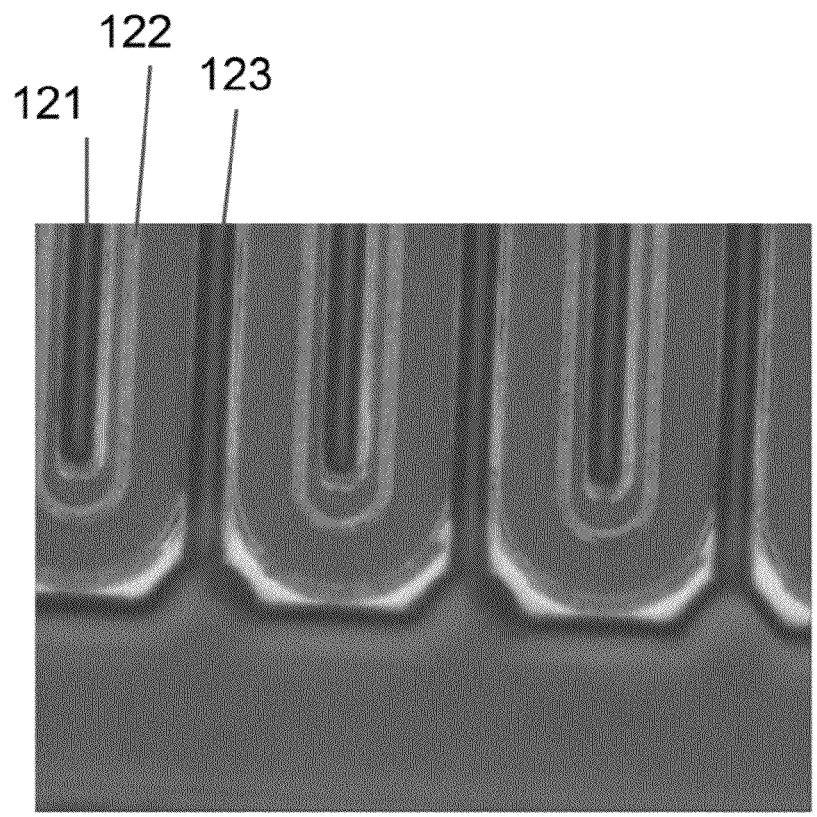
FIG. 9C is a photograph as a substitute for a drawing showing an electrode structure of Comparative Example manufactured for comparison with Example 1.

As Comparative Example, a field-effect transistor having an electrode structure (comb-shaped structure) of a conventional example shown in FIG. 9C was manufactured in a range of 1 mm square on the first surface of a semiconductor layer.

In Comparative Example, source electrodes 121, gate electrodes 122, and drain electrodes 123 constituted the comb-shaped structure with the same distance (interval) between these electrodes and gate length as those of Example 1. Here, the electrode structure had 66 fingers for the gate electrode having a length of 1 mm, 34 fingers for the source electrode having a length of 1 mm, and 33 fingers for the drain electrode having a length of 1 mm. The field-effect transistor of the comparative example was set to have the same distances among the source electrode, drain electrode, and gate electrode as those in Example 1. In order to optimize the characteristics of the low on-resistance and the high maximum current, the number of fingers and finger length of the source electrodes, and the number of fingers and finger length of the drain electrodes were measured to compare with Example 1.

Figure 9D:
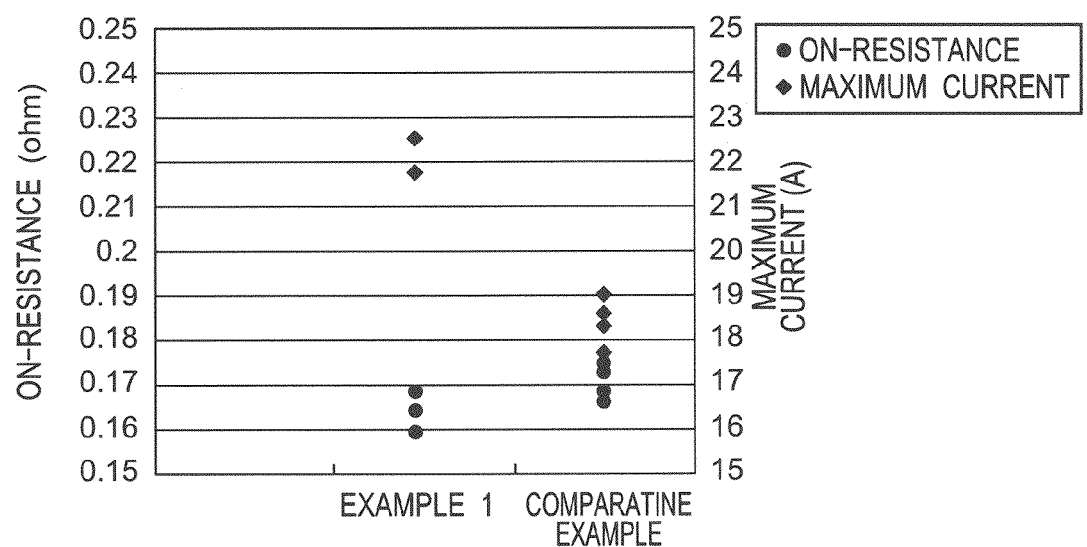
FIG. 9D is a graph showing the on-resistance and the maximum current of each of the field-effect transistor of Example 1 and a field-effect transistor of Comparative Example.

As shown in FIG. 9D, the field-effect transistor of Example 1 manufactured in the way mentioned above was able to have the low on-resistance and the high maximum current.

According to the embodiments of the present invention, a field-effect transistor with a plurality of unit elements includes:

a semiconductor layer having a first surface, a plurality of drain electrodes respectively provided corresponding to the unit elements on the first surface;

gate electrodes respectively provided around the drain electrodes and corresponding to the unit elements on or above the first surface;

source electrode electrically continuously provided across the unit elements outside the gate electrodes on the first surface and having narrow parts between the gate electrodes belonging to the adjacent unit elements and spaced apart from each other, the narrow parts having a width narrower than that of other parts thereof;

an insulating film having openings provided on the source electrode, the insulating film covering the source electrode across the plurality of unit elements, the openings are arranged at the other parts on both sides of each of the narrow parts; and a wiring provided on the insulating film to be connected to the source electrode via the openings so as to be arranged in parallel to each of the narrow parts.

With the above arrangement, the embodiment of the present invention provides a miniaturized field-effect transistor that can achieve the high maximum current by increasing a channel area per unit area.

Obviously, numerous modifications and variations of the present invention are possible in light of the above teachings. It is therefore to be understood that within the scope of the appended claims, the invention may be practiced otherwise than as specifically described herein.

What is claimed is:

1. A field-effect transistor comprising:
a plurality of unit elements comprising:
a semiconductor layer having a first surface;
a plurality of drain electrodes provided on the first surface, respectively;
gate electrodes provided on or above the first surface around the drain electrodes, respectively; and
a source electrode electrically continuously provided across the plurality of unit elements outside the gate electrodes on the first surface and having narrow parts between the gate electrodes which are spaced apart from each other and which belong to adjacent unit elements among the plurality of unit elements, the narrow parts having a width narrower than a width of other parts of the source electrode;
an insulating film having openings provided on the source electrode, the insulating film covering the source electrode across the plurality of unit elements, the openings being arranged at the other parts of the source electrode on both sides of each of the narrow parts; and
a wiring provided on the insulating film to be connected to the source electrode via the openings so as to be arranged in parallel to each of the narrow parts.

2. The field-effect transistor according to claim 1, wherein the narrow parts and the other parts of the source electrode are alternately arranged and the wiring is connected to the source electrode via each of the openings.

3. The field-effect transistor according to claim 1, wherein the source electrode is provided to have a constant distance from a gate electrode among the gate electrodes which is provided in each of the plurality of unit elements.

4. The field-effect transistor according to claim 1, wherein the plurality of drain electrodes are arranged in such a manner that a center of each of the plurality of drain electrodes coincides with a grid point of a triangle grid, the grid point comprises a first grid point and a second grid point which are adjacent to each other, and a width of the source electrode positioned on a straight line connecting the first grid point and the second grid point is narrow as compared to the other parts of the source electrode.

5. The field-effect transistor according to claim 1, wherein the plurality of drain electrodes are arranged in such a manner that a center of each of the plurality of drain electrodes coincides with a grid point of a square grid, the grid point comprises a first grid point and a second grid point which are adjacent to each other, and a width of the source electrode positioned on a straight line connecting the first grid point and the second grid point is narrow as compared to the other parts of the source electrode.

6. The field-effect transistor according to claim 4, further comprising a gate electrode connection part provided on a straight line connecting a third grid point and a fourth grid point which are aligned in one direction of the triangle grid or a square grid to connect between the gate electrodes belonging to the adjacent unit elements among the plurality of unit elements, wherein the grid point comprises the third grid point and the fourth grid point which are adjacent to each other, and the source electrode is separated by the gate electrode connection part.

7. The field-effect transistor according to claim 5, further comprising a gate electrode connection part provided on a straight line connecting a third grid point and a fourth grid point which are aligned in one direction of a triangle grid or the square grid to connect between the gate electrodes belonging to the adjacent unit elements among the plurality of unit elements, wherein the grid point comprises the third grid point and the fourth grid point which are adjacent to each other, and the source electrode is separated by the gate electrode connection part.

8. The field-effect transistor according to claim 1, wherein a drain electrode among the plurality of drain electrodes is provided in a circular shape, and the gate electrodes are provided in a circular annular shape.

9. The field-effect transistor according to claim 1, wherein a drain electrode among the plurality of drain electrodes is provided in a hexagonal shape, and the gate electrodes are provided in a hexagonal annular shape.

10. The field-effect transistor according to claim 1, wherein a drain electrode among the plurality of drain electrodes is provided in a square shape, and the gate electrodes are provided in a square annular shape.

11. A field-effect transistor comprising:
a plurality of unit elements comprising:
a semiconductor layer having a first surface;
a plurality of drain electrodes provided on the first surface, respectively;
gate electrodes provided on or above the first surface around the drain electrodes, respectively;
a source electrode electrically continuously provided across the plurality of unit elements outside the gate electrodes on the first surface and having narrow parts between the gate electrodes which are spaced apart from each other and which belong to adjacent unit elements among the plurality of unit elements, the narrow parts having a width narrower than a width of other parts of the source electrode; and
the plurality of drain electrodes being arranged in such a manner that a center of each of the plurality of drain electrodes coincides with a grid point of a triangle grid, the grid point comprises a first grid point and a second grid point which are adjacent to each other, and a width of the source electrode positioned on a straight line connecting the first grid point and the second grid point is narrow as compared to the other parts of the source electrode;
an insulating film having openings provided on the source electrode, the insulating film covering the source electrode across the plurality of unit elements, the openings being arranged at the other parts of the source electrode on both sides of each of the narrow parts; and
a wiring provided on the insulating film to be connected to the source electrode via the openings so as to be arranged in parallel to each of the narrow parts.

12. The field-effect transistor according to claim 11, further comprising a gate electrode connection part provided on a straight line connecting a third grid point and a fourth grid point which are aligned in one direction of the triangle grid or a square grid to connect between the gate electrodes belonging to the adjacent unit elements among the plurality of unit elements, wherein the grid point comprises the third grid point and the fourth grid point which are adjacent to each other, and the source electrode is separated by the gate electrode connection part.

13. The field-effect transistor according to claim 12, wherein a drain electrode among the plurality of drain electrodes is provided in a circular shape, and the gate electrodes are provided in a circular annular shape.

14. The field-effect transistor according to claim 12, wherein a drain electrode among the plurality of drain electrodes is provided in a hexagonal shape, and the gate electrodes are provided in a hexagonal annular shape.

15. The field-effect transistor according to claim 12, wherein a drain electrode among the plurality of drain electrodes is provided in a square shape, and the gate electrodes are provided in a square annular shape.

* * * * *